United States Patent
De Vries

(10) Patent No.: US 9,438,106 B2
(45) Date of Patent: Sep. 6, 2016

(54) HYSTERETIC CURRENT MODE CONTROLLER FOR A BIDIRECTIONAL CONVERTER WITH LOSSLESS INDUCTOR CURRENT SENSING

(75) Inventor: Ian Douglas De Vries, Cape Town (ZA)

(73) Assignee: Balancell (Pty) Ltd, Cape Town (ZA)

(*) Notice: Subject to any disclaimer, the term of this patent is extended or adjusted under 35 U.S.C. 154(b) by 533 days.

(21) Appl. No.: 13/983,732

(22) PCT Filed: Feb. 8, 2012

(86) PCT No.: PCT/ZA2012/000006
§ 371 (c)(1),
(2), (4) Date: Aug. 5, 2013

(87) PCT Pub. No.: WO2012/109680
PCT Pub. Date: Aug. 16, 2012

(65) Prior Publication Data
US 2013/0307511 A1 Nov. 21, 2013

(30) Foreign Application Priority Data

Feb. 11, 2011 (ZA) .................. 2011/01112

(51) Int. Cl.
*H02M 3/156* (2006.01)
*H02M 1/00* (2006.01)
*G01R 19/00* (2006.01)

(52) U.S. Cl.
CPC ........... *H02M 3/156* (2013.01); *H02M 3/1563* (2013.01); *G01R 19/0092* (2013.01); *H02M 2001/0009* (2013.01); *H02M 2001/0025* (2013.01)

(58) Field of Classification Search
CPC ................... H02M 2001/0025; H02M 3/156; H02M 3/158; H02M 3/1588; H02M 3/1563; H02M 2003/1566; G05B 11/36; G05B 11/42
See application file for complete search history.

(56) References Cited

U.S. PATENT DOCUMENTS

| 4,866,367 A | * | 9/1989 | Ridley | ............... H02M 3/1563 323/287 |
|---|---|---|---|---|
| 5,177,676 A | * | 1/1993 | Inam | ...................... G05F 1/563 323/285 |

(Continued)

FOREIGN PATENT DOCUMENTS

WO WO2006112991 A2 10/2006
WO WO2008094232 A1 8/2008

OTHER PUBLICATIONS

Dallago et al., "Lossless Current Sensing in Low-Voltage High-Current DC/DC Modular Supplies," *IEEE Transactions on Industrial Electronics*, Dec. 2000, vol. 47, No. 6, pp. 1249-1252.

(Continued)

*Primary Examiner* — Fred E Finch, III
(74) *Attorney, Agent, or Firm* — Klarquist Sparkman, LLP

(57) ABSTRACT

A system and circuit for achieving bidirectional hysteretic current mode control of a converter. The system comprises a summer that provides a constant hysteresis and has added switching noise immunity, a comparator, a lossless inductor current sense means and a converter. A circuit using the inductors internal resistance for sensing the current through an inductor in a lossless manner is described. The circuit preserves both DC and dynamic current information while incorporating the RC time constant, difference amplifier and signal amplification, all using only one amplifier. This circuit provides excellent common mode and differential noise immunity, while still having a high bandwidth and small group delay of the current signal. A method to accomplish stability of a current mode controlled converter when closing the loop to control the output voltage with very high accuracy and gain is described.

2 Claims, 8 Drawing Sheets

Hysteretic current mode controlled bidirectional converter

(56) References Cited

U.S. PATENT DOCUMENTS

| | | | |
|---|---|---|---|
| 6,249,447 B1 * | 6/2001 | Boylan | G01R 19/0092 |
| | | | 363/131 |
| 6,356,461 B1 | 3/2002 | Jacobs | |
| 2004/0004470 A1 | 1/2004 | Yoshida et al. | |
| 2007/0035281 A1 | 2/2007 | Kuroiwa et al. | |
| 2008/0197826 A1 * | 8/2008 | Schiff | H02M 3/156 |
| | | | 323/282 |
| 2009/0146643 A1 | 6/2009 | Ostrom et al. | |
| 2009/0284235 A1 * | 11/2009 | Weng | H02M 3/156 |
| | | | 323/222 |
| 2010/0181975 A1 * | 7/2010 | Piselli | H02M 3/33507 |
| | | | 323/282 |
| 2011/0074392 A1 * | 3/2011 | Bartlett | G01R 1/06766 |
| | | | 324/76.44 |

OTHER PUBLICATIONS

International Search Report for PCT/ZA2012/000006, dated Oct. 1, 2012, 6 pages.

Simon-Muela et al., "Practical Implementation of a High-Frequency Current-Sense Technique for VRM," *IEEE Transactions on Industrial Electronics*, Sep. 2008, vol. 55, No. 9, pp. 3221-3230.

* cited by examiner

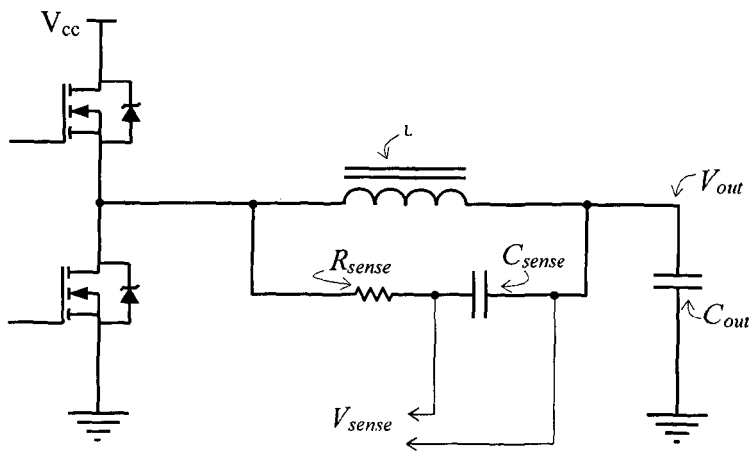
Figure 1. Prior art - lossless current sensing method
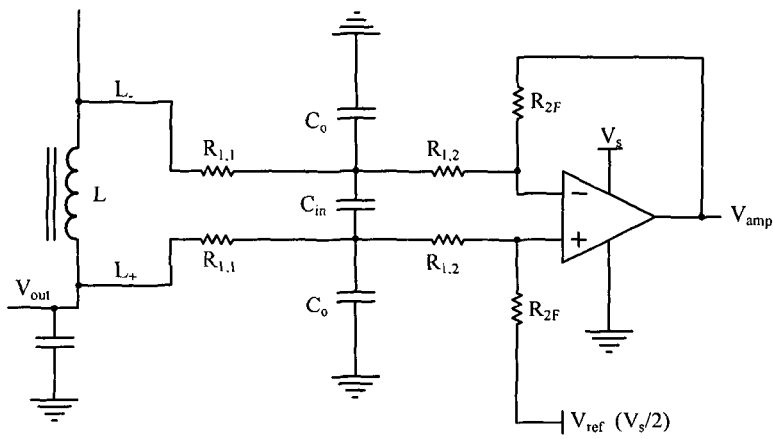
Figure 2. RC time constant integrated into the difference amplifier circuit
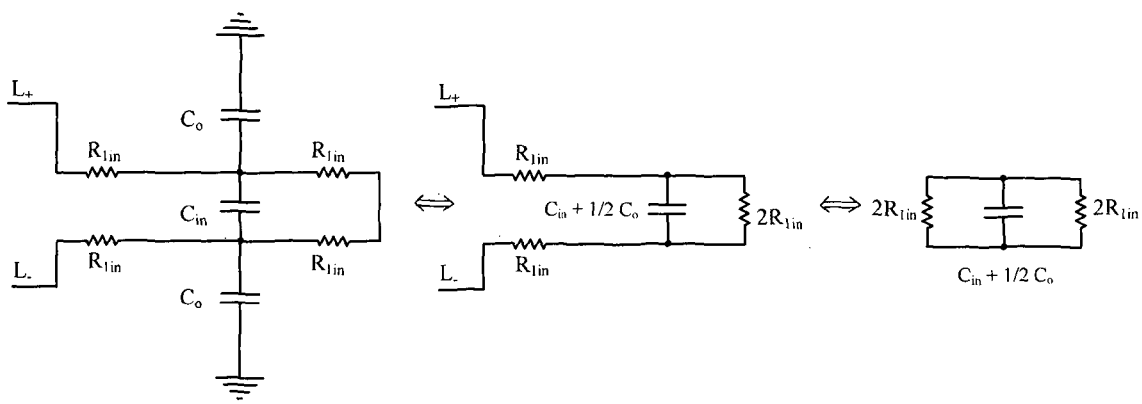
Figure 3. Equivalent RC time constant circuit of input stage

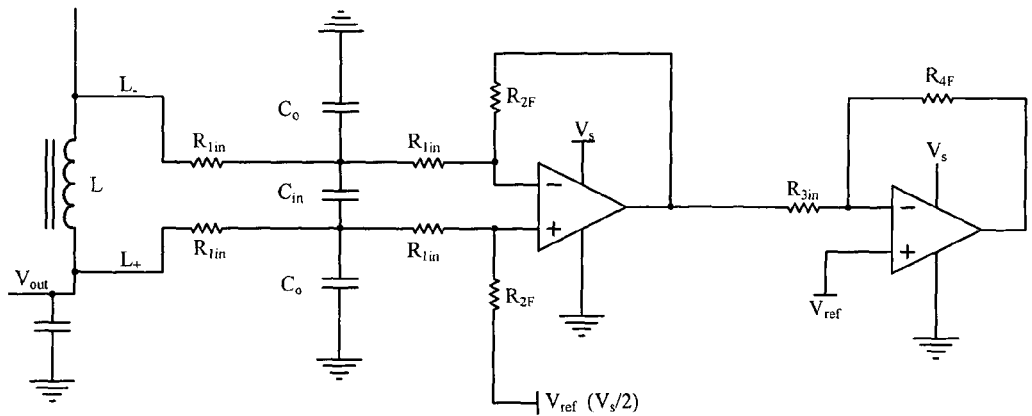
Figure 4. Cascading amplifiers to increase overall GBW product
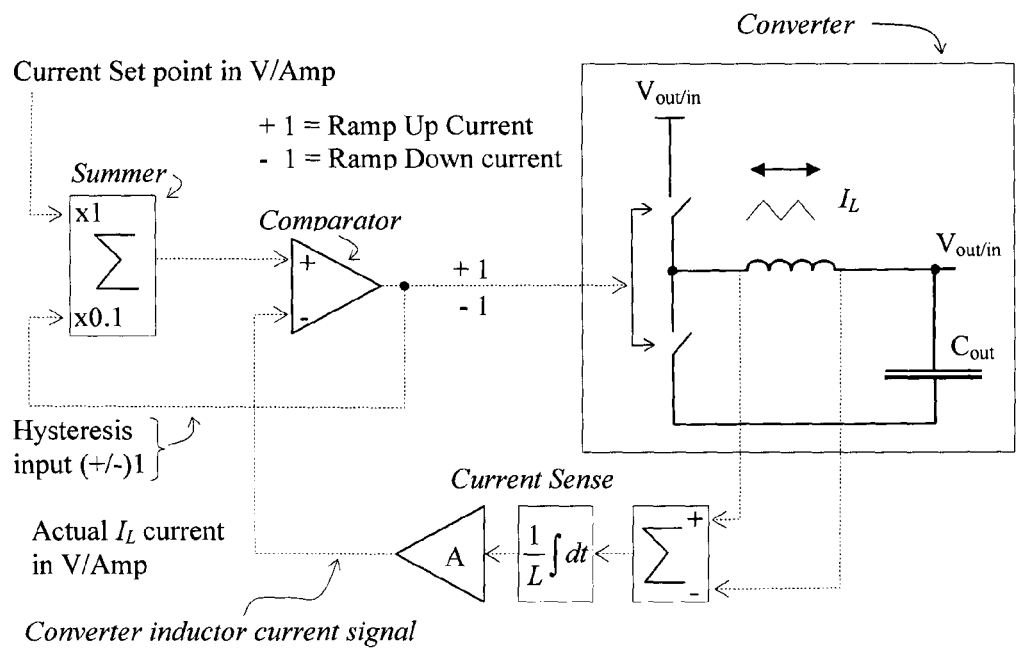
Figure 5. Method to add symmetrical and constant hysteresis

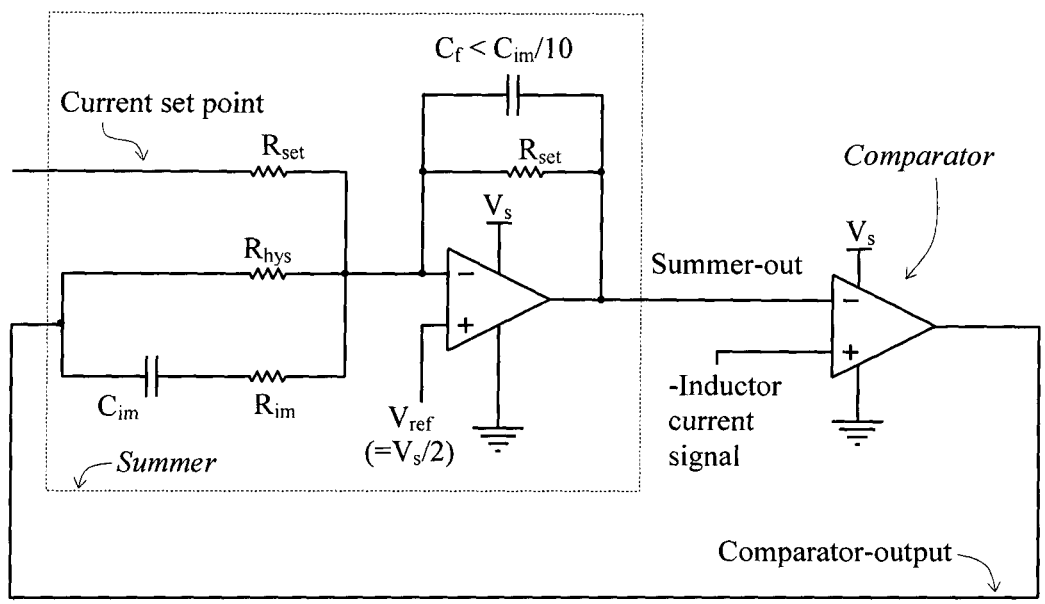
Figure 6. Summer circuit with added switching noise immunity

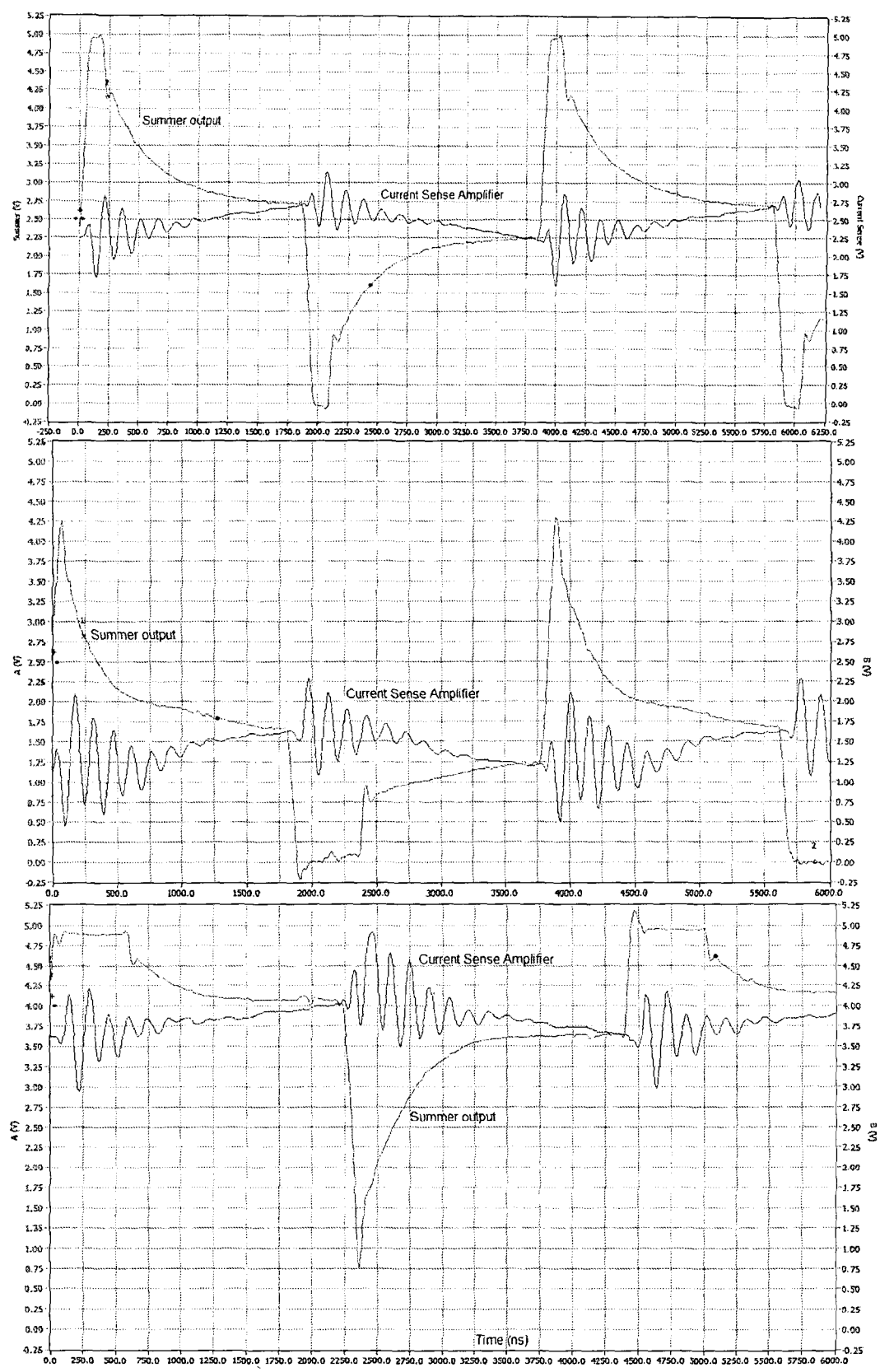
Figure 7. Summer and current sense amplifier waveforms

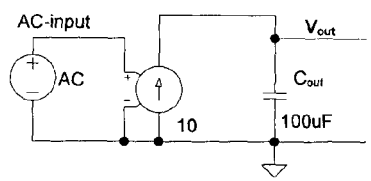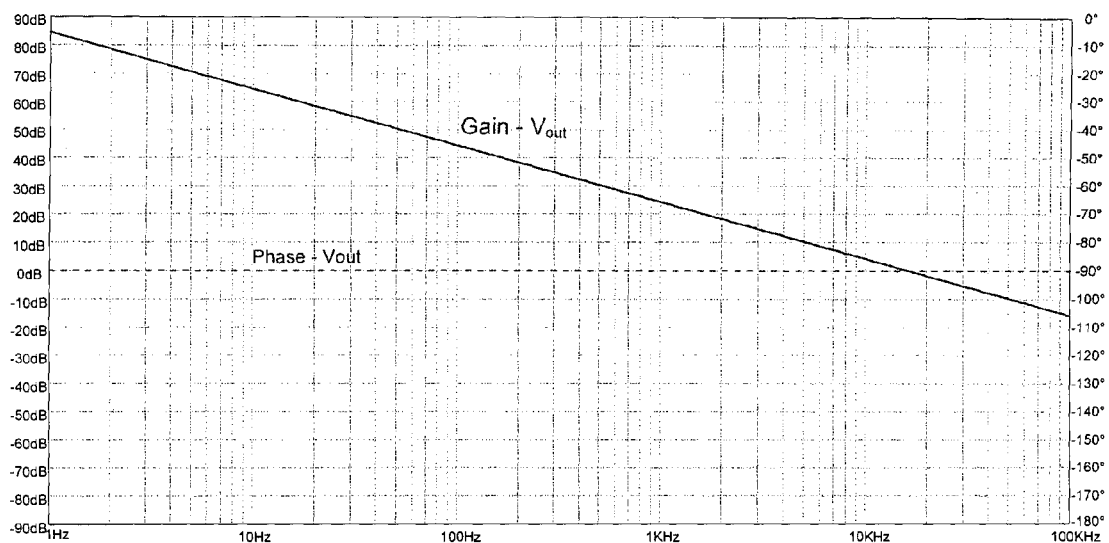
Figure 8. Ideal voltage controlled current source bode plot

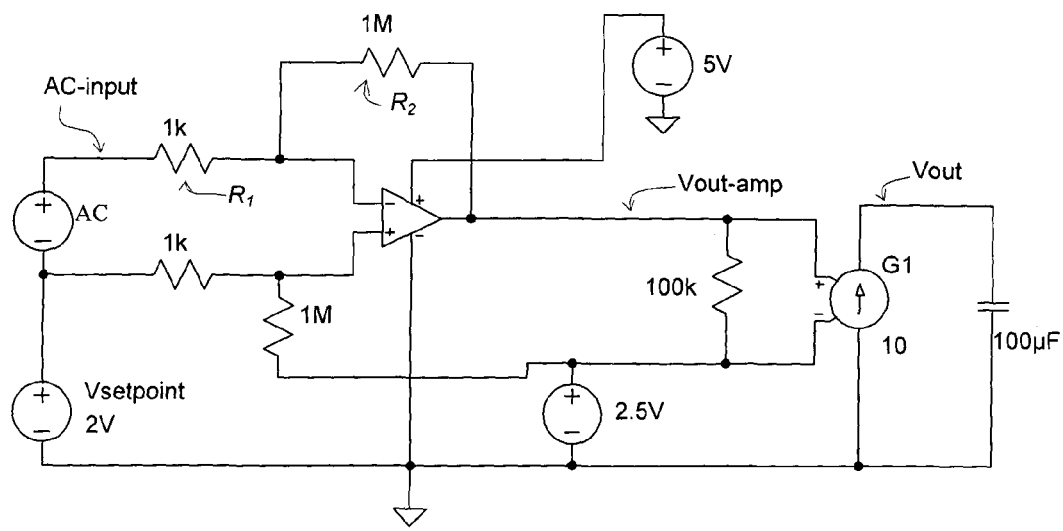
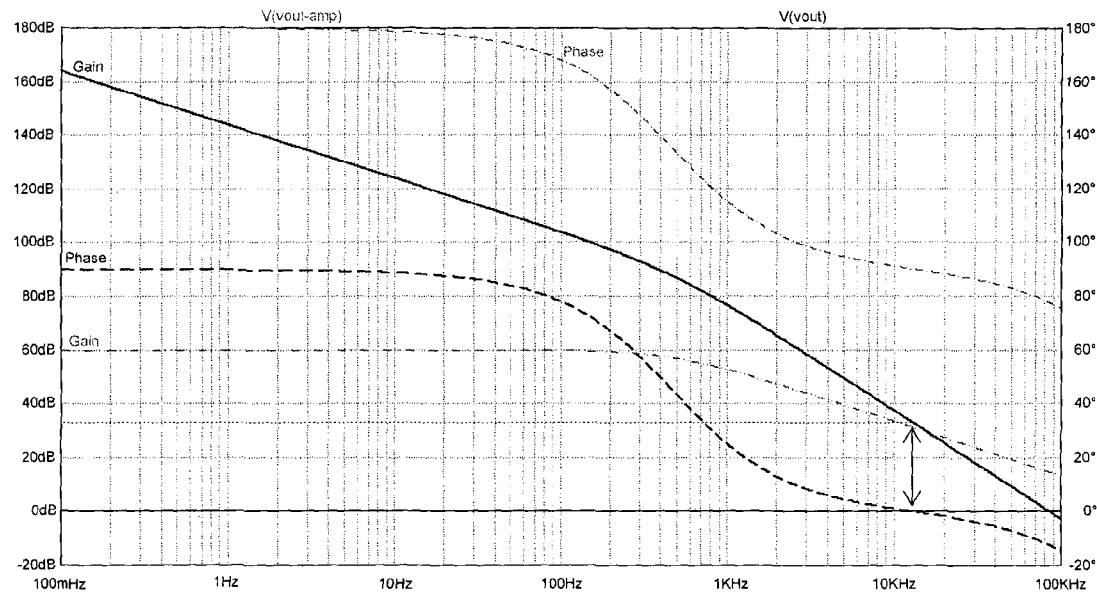
Figure 9. Bode plot with instrumentation amplifier added

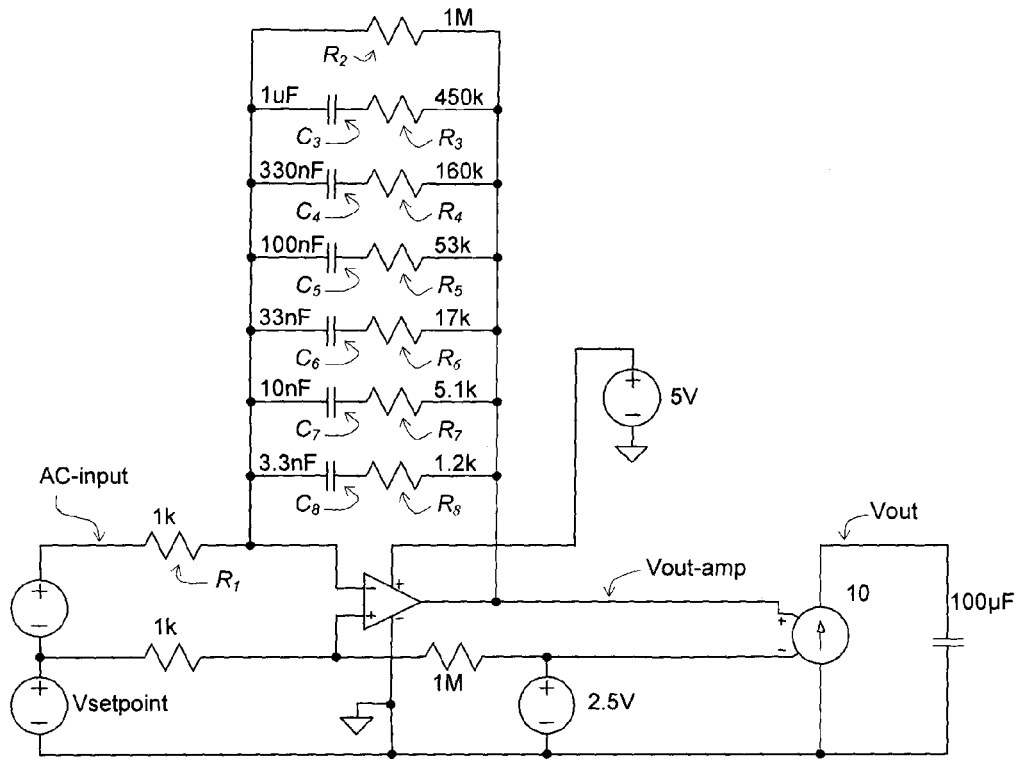
Figure 10. Voltage control loop compensation circuit
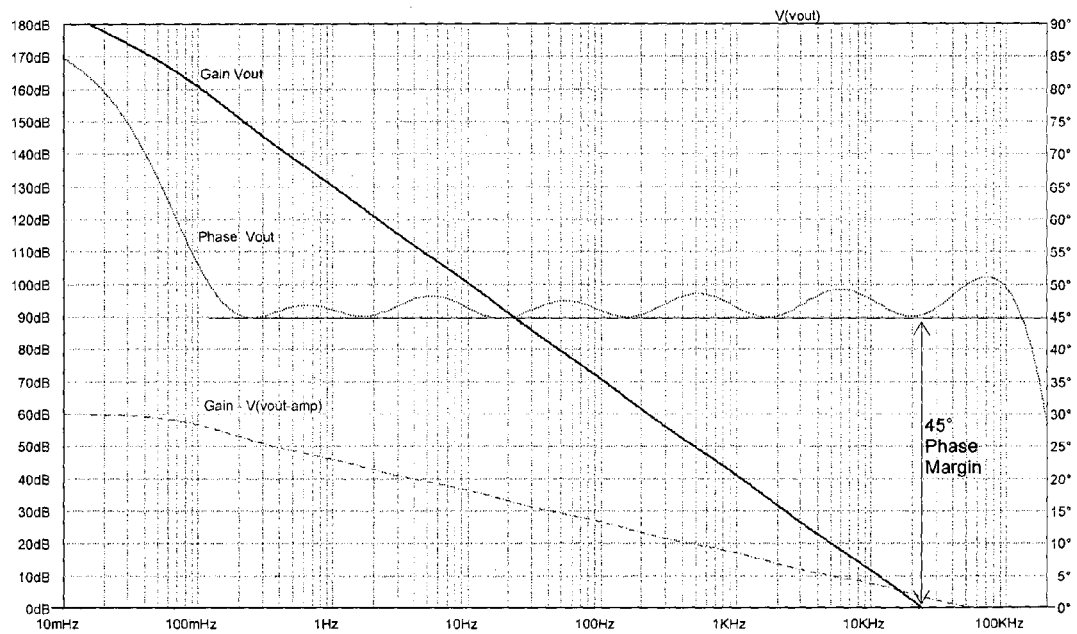
Figure 11. Final bode plot with loop compensation

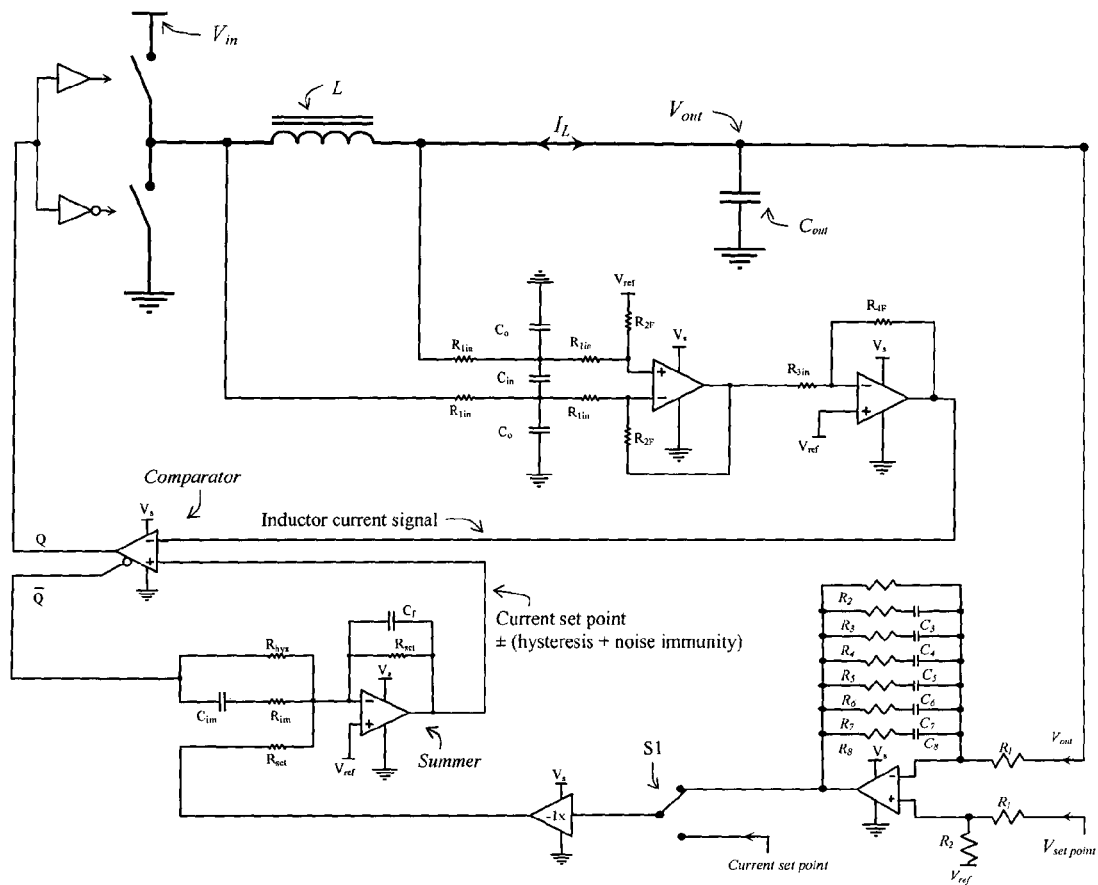
Figure 12. Hysteretic current mode controlled bidirectional converter

HYSTERETIC CURRENT MODE CONTROLLER FOR A BIDIRECTIONAL CONVERTER WITH LOSSLESS INDUCTOR CURRENT SENSING

CROSS REFERENCE TO RELATED APPLICATIONS

This is the U.S. National Stage of International Application No. PCT/ZA2012/000006, filed Feb. 8, 2012, which was published in English under PCT Article 21 (2), which in turn claims The benefit of South Africa Application No. 2011/01112, filed Feb. 11, 2011.

BACKGROUND

The advantages of current mode control in a DC-DC converter or DC-AC inverter are well known in the literature. It for most practical purposes reduces a second order system to a first order system making its control and current limiting easier to implement. Peak current or valley mode control are two typical methods of achieving this. These methods either detect only the peak or trough of the inductor current and make assumptions for the other side's limit by having constant off times etc. These methods would be difficult to implement for true bidirectional current mode control as one direction of the current would remain unlimited or uncontrolled. Hence, to attain true bidirectional current mode control, the instantaneous current flowing through the active inductor element should be known at all times (i.e. for both switching cycles) and the inductor ripple current controlled on both sides of the desired set point. This requires that the current through the inductor is measured continuously with as little time delay as possible so as to obtain a true representation of it, and then controlled using both an upper and a lower limit around the desired set point.

This patent sets out a method and circuitry for lossless measurement of inductor current in a converter and using it for hysteretic type true instantaneous bidirectional current mode control. It can be used in many configurations where there is an inductive energy storage element driven by a switching circuit. Typically, this will be a half or full bridge used in a non-isolated buck, boost, buck/boost or inverter configurations.

The first part details a method and circuitry to measure the instantaneous bidirectional current through an inductor in a lossless manner. The second part details a system and circuitry to control the current with true bidirectional hysteretic type control with very good noise immunity. The third part details a method and circuitry to accomplish stability when closing the loop to control the output voltage of a hysteretic current mode controlled converter with a very high gain and accuracy.

SUMMARY OF INVENTION

A circuit for sensing the current through an inductor in a lossless manner using the inductors internal resistance is described. The circuit preserves both DC and dynamic current information and incorporates the RC time constant, difference amplifier and signal amplification into one circuit using one amplifier. This circuit provides excellent noise immunity, while still having a high bandwidth and small group delay for the current signal. Equations are provided to design the RC circuit values to match the time constant of the inductor's inductance and internal resistance.

A system and circuit for achieving bidirectional hysteretic current mode control with constant hysteresis is described. The system comprises a summer, comparator, inductor current sense means and a converter. A circuit for implementing the system and summer above with added switching noise immunity is described.

A method to accomplish stability when closing the loop to control the output voltage of a current mode controlled converter when using a very high gain is described. It uses a simple proportional difference amplifier between the desired output voltage set point and the actual output voltage and only a feedback resistor setting the high DC gain. Parallel RC stages are then added across the feedback resistor to roll gain off in such a manner that the phase margin always remains above forty five degrees.

BRIEF DESCRIPTION OF DRAWINGS

FIG. 1. Prior method of lossless inductor current sensing using an RC circuit
FIG. 2. Shows the RC time constant circuit integrated into the difference amplifier circuit
FIG. 3. Equivalent RC time constant with difference amplifier
FIG. 4. Cascading amplifiers to increase GBW product
FIG. 5. Method to add symmetrical and constant hysteresis
FIG. 6. Summer circuit with added switching noise immunity
FIG. 7. Summer and current sense amplifier waveforms
FIG. 8. Ideal voltage controlled current source bode plot
FIG. 9. Bode plot with instrumentation amplifier added
FIG. 10. Voltage control loop compensation circuit
FIG. 11. Final bode plot with loop compensation
FIG. 12. Hysteretic current mode controlled bidirectional converter

DETAILED DESCRIPTION OF INVENTION

Current Sense Amplifier

The first part of this invention is to measure the instantaneous current through the inductor and obtain a voltage representation of it for use in the control circuitry. Firstly, the measurement should be done with as little time delay as possible so as to have as close as possible representation of the instantaneous current through the inductor. Large group delays in the signal mean that the true current could considerably overshoot before control action happens. Delays also add to phase lags and make it more difficult to accomplish overall circuit stability. Secondly, for bidirectional control the current should be measured during all switching cycles. Thirdly the current measurement should add little or negligible additional loss to the converter.

Adding a current sense resistor in series with the inductor, with suitable amplification, will allow us to attain the first two requisites. However, it adds another lossy component, which for low voltage (<12V) and high current converters can be a significant percentage of the total loss. This sense resistor will therefore decrease efficiency, add cost and increase the size and weight of the converter.

To avoid the disadvantages associated with a current sense resistor, lossless inductor current sensing has been introduced previously in the literature. It is done by realising that the inductors own internal resistance and its inductance have an exponential type current rise, similar to the voltage in a RC circuit. Hence an RC circuit is placed across the inductor so that the time constant $R_{sense}C_{sense}=L/R_L$, where L is the inductance of the inductor and $R_L$ is the internal DC resistance of the inductor. This is illustrated in FIG. 1. If the RC time constant is correct then the voltage across the capacitor, $V_{sense}$, is directly proportional to the instantaneous current (both DC and dynamic) in the inductor. The actual current value is the voltage across the capacitor divided by the inductor DC resistance, $I_L=V_{sense}/R_L$.

For example, an inductance with an internal resistance of 1 milliohm, the voltage across this capacitor, $V_{sense}$, will be 1 mV per Amp. This is a fairly small voltage in close proximity to switching circuits and switching voltages. The $V_{sense}$ voltage also has a common mode voltage equal to the output voltage, $V_{out}$.

The challenge is to now use this voltage, $V_{sense}$, across the capacitor and amplify it enough in presence of a relatively large common mode voltage, switching noise sources and large voltage spikes. One end of the inductor is tied to a switching node and other either being a DC output or a AC inverter output, hence both ends will have large voltage swings. In addition to make a bigger challenge this has to be done with as little group delay as possible and with a very high bandwidth.

As we are referring to a switch mode circuit, the current through the inductor will have a ripple, usually triangular. Since we are trying to obtain a true representation of this current and its ripple, the bandwidth we need will be considerably higher than the switching frequency. For example, if switching frequency is 200 kHz, the current waveform will be a triangular shape at 200 kHz, and in order to amplify this with reasonable signal integrity, we would have to amplify at least the fifth and probably the seventh harmonic, which is 1.4 MHz. Assuming we have a inductance of 1 milliohm internal resistance, giving 1 mV/A, and we want to amplify it to 50 mV/A, we need a gain of 50. This means the overall Gain Bandwidth we need is approximately 50*1.4 MHz=70 MHz. The maximum slew rate of the amplified signal must be also be considered to select amplifiers required.

These requirements present a considerable challenge as we have to amplify a small signal difference in presence of high noise, with a wide bandwidth, meaning we can not use any traditional circuits and low pass filters to reduce noise. In addition it has to be done with as low a component count as possible to reduce cost and power requirements. The DC voltage difference information must also be kept, and hence using capacitors to decouple the common mode voltages is not an option.

Many different circuit configurations were attempted but had problems such as too much noise, too many amplifiers, too much group delay etc. The circuit of FIG. 2 was found to work very well and, attains a good balance of all the above requirements. It incorporates the Resistance and capacitance required by the RC time constant circuit into the difference amplifier circuit it self, which allows it to provide noise filtering as well.

It can be understood by looking separately at the common mode signal response (AC and DC), and differential signal response (AC and DC). As this is a difference amplifier circuit, the requirement is that there is no output change to common mode voltages. Hence both inputs ($L_+$ and $L_-$) must respond identically to common mode (both AC and DC) signals. In order for this to happen then all values on positive input side must equal all values on negative input i.e. ($R_{1,1}$, $R_{1,2}$, $R_{2F}$, $C_o$) on positive input MUST equal respective values ($R_{1,1}$, $R_{1,2}$, $R_{2F}$, $C_o$) on the negative input side. Given that ($R_{1,1}$, $R_{1,2}$, $R_{2F}$, $C_o$) on positive input equal respective values ($R_{1,1}$, $R_{1,2}$, $R_{2F}$, $C_o$) on negative input, then one of the main reasons the circuit worked very well in practice, is because common mode AC noise is filtered equally on both input paths. Having positive and negative input paths filtered equally appears to be critical in practice and is the reason many other circuit implementations did not perform very well.

The amplifier response to common mode DC signal can been seen by simply ignoring all capacitors. The circuit can then be seen to be a standard difference amplifier with a gain of $R_{2F}/(R_{1,1}+R_{1,2})$, and common mode DC signals will not be amplified. If $C_o$ on both sides are equal, then the impedance of the input path on both sides will be identical for common mode AC signals (assume $V_{amp}=V_{ref}$). Hence there will be no difference in the voltages at the two inputs to the amplifier, and all that happens is that the common mode voltage takes longer to appear across the two capacitors to ground. This is actually desirable as it slows down the appearance of the common mode voltage to amplifier inputs i.e. it low pass filters common mode voltages.

The response to DC differential signals can also be seen by simply ignoring the capacitors. Again it can be seen to be a standard difference amplifier circuit with a gain of $R_{2F}/(R_{1,1}+R_{1,2})$. Hence for DC signal or DC current through the inductor, the output amplifier voltage will be $V_{amp}=I_L*R_L*R_{2F}/(R_{1,1}+R_{1,2})$, where $I_L$ is the current through the inductor, and $R_L$ is it's internal DC resistance.

The response to AC differential signals is a little more complex. To aid in the analysis we can first look at equivalent circuits. To find the equivalent RC time constant circuit we will just look at the input circuit stage up until the inputs of the amplifier. To analyse this to a first order approximation, we can assume the since the two inputs of the amplifier are at the same potential, we can tie them together. The equivalent input circuit is then shown in FIG. 3. In the case that $R_{1,1}=R_{1,2}=R_{1in}$ which is the case shown in FIG. 3, then the time constant of this circuit can be shown to be $R_{1in}*(C_{in}+\frac{1}{2} C_o)$. However the voltage appearing across $C_u$, is only half the voltage that would appear across a simple RC circuit. This is then compensated for by the fact that the gain of the difference amplifier from the $C_{in}$ onwards is actually twice that of the input (as now only have half the input resistance). The overall response to AC difference signals is then exactly the same as for DC difference signals. Hence provided $R_{1,1}=R_{1,2}=R_{1in}$, then for both DC and AC difference signals, the amplifier output will be $$V_{amp}=I_L*R_L*(R_{2F}/2R_{1in})$$

and the time constant should be selected so that $$R_{1in}*(C_{in}+1/2C_o)=L$$

Different resistances on the input side lead to a complex analysis, but can possibly be tuned correctly using circuit simulations. The circuit can be connected either way across inductor, but may be advisable to connect the positive input side of amplifier to the side of the inductor with slower voltage swings, usually Vout. This means there will be slightly less common mode voltage swing on the inputs. However in practice using a high bandwidth amp, connecting the circuit either way did not make any observable difference to signal fidelity. The circuit is fully bidirectional and will provide a positive or negative current signal biased around $V_{ref}$. A ground based reference with negative supply to amplifiers could also be used. The common mode input range of the amplifier should at least equal the range of the output voltage. The bandwidth should be as high as necessary to obtain signal fidelity and group delay required at the switching frequency. The amplifier can be cascaded with normal amplifying circuits to increase overall gain bandwidth product such as shown in FIG. 4. If the total gain required is then split equally across the amplifiers then the overall group delay can be reduced. As we can now sense and measure both dynamic and DC inductor current with little delay, the second part of this patent deals with the problem of using this information to actually control the current.

Bidirectional Hysteretic Controller

As mentioned previously, the advantages of current mode control of a DC-DC converter or a DC-AC inverter are well known in the literature. True current mode control assumes that the current level can be set instantly. In other words the circuit should act as an ideal controlled current source and the instantaneous current has to be known and changed instantly (or fast enough to not affect rest of circuit) to the desired set point.

As this is a switch mode type circuit, the current will have a triangular ripple shape around the average value. Various methods of current mode control exist, such as peak or valley mode control. Both of these sense only either current peaks or current troughs (valleys) but not both. Hence, neither of these methods are suitable for a bidirectional converter.

To attain the fastest and tightest control possible over the inductor current in a switch mode type converter, the current should ramp up or down a fixed amount around the set point i.e. the controller should detect in real time when the current reaches the specified level above the set point, and then switch the input or bridge, so that the current ramps down. Similarly as the current is decreased, the controller should detect in real time when the current reaches the specified level below the set point, and then switch the input or bridge, so that the current ramps up. This is essentially hysteretic type control with an upper and lower limit around the set point.

The implementation of a simple hysteretic controller is usually done with a comparator, with set point being feed into the positive input and desired control variable being feed into the negative input. The comparator should have some hysteresis so that there is some time in between switching events. Although this is a very simple circuit, it is not very versatile or adaptable, and has many practical problems with noise, hysteresis etc when using it in a switch mode converter.

Therefore in order to control the current in a more precise manner with a very constant and set amount of hysteresis around the desired set point, a better method was required. The conceptual control diagram in FIG. 5 illustrates how this was attained. The current set point is feed into a summer with a gain of 1. The output of the comparator which is assumed to be +1 or −1 is also feed into the summer but with a gain of 0.1, referred to as the hysteresis gain. This is adjustable and it determines the amount of hysteresis added and hence the peak to peak current ripple. If the output of the comparator is high (+1), then output of the summer will be (set point +0.1) and the current in the inductor will ramp up until it reaches this point. At this stage the comparator will switch to low (−1), and the output of the summer will then be (set point −0.1), and the current will ramp down until it reaches this point, switching the comparator again and repeating the cycle.

Thus it can be seen that the peak to peak ripple current is always constant at 0.2, and is symmetrical around the set point. The switching frequency will be determined by the amount of hysteresis which sets the peak to peak ripple, the input and output voltages and the value of the inductor. It can also be seen that this circuit is completely bidirectional, and the current set point can be positive or negative. A bidirectional current limit can be attained simply by limiting the maximum and minimum level of the current set point.

$$\text{Actual peak to peak current ripple=volts per amp}$$
$$\text{gain } (V/A)*\text{hysteresis gain}*2$$

The fixed amount of hysteresis in the method of FIG. 5 will inherently provide a certain amount of noise immunity. The amount of hysteresis required is determined by the operating voltages, the inductor and the desired peak to peak current ripple or switching frequency.

However, even though the hysteresis provides some noise immunity, a problem arises as we are sensing a relatively small current signal and amplifying it with a reasonably high gain (~>50) and a very high bandwidth (>50 MHz). This means the current sensing circuitry is unavoidably susceptible to noise, and in addition it has to be in close proximity to the switching power stage. Hence during and just after the switching transition there will be noise and ringing on the current sense signal. This can be seen in FIG. 7 where the triangular inductor current waveform has ringing on it after the switching transitions. Consequently the method of FIG. 5 alone does not provide enough noise immunity in practise.

This problem could be solved in a variety of ways, for example, using one shot timing circuits and logic gates and forcing the comparator to latch for a period just after a switching event. Many of these solutions required a fair amount of additional circuitry and/or added delays to switching signal chain. A very simple solution was devised that only required two extra capacitors, a resistor and proved to work very well in practise. It did not add any extra delay to the switching signal chain and it simply entailed adding an extra RC circuit of correct values to the summer used in the method of FIG. 5. The full summer circuit is shown in FIG. 6 with the RC circuit that provides the extra noise immunity.

The hysteresis resistor in FIG. 6 sets the hysteresis gain and should be selected to provide the peak to peak current ripple required. It is calculated using the voltage output swing of comparator times the hysteresis gain. As a starting point for the noise immunity RC circuit, the resistor $R_{im}$ should be selected to roughly equal R (of current set point) and the capacitor $C_{im}$ selected so that the time constant of $R_{im}C_{im}$ is approximately ⅙ of the switching period. These values can then be refined by simulation. The idea is that when the current set point is zero, then the output of the summer swings almost rail to rail after the switching transitions. This provides the maximum noise margin possible right after each switching event. However it should return to correct level before current reaches it, which it will do if the $R_{im}C_{im}$ time constant is designed correctly. As the current set point changes, then after a switching event the output of the summer will then saturate for a while on one rail, which will also prevent the comparator from false triggering. With correct $R_{im}C_{im}$ time constant, the summer should come out of saturation in time to bring its output back to the correct switching level. The operating waveforms of the circuit can be seen in FIG. 7, which shows the output waveforms of the summer, and the output waveforms of the current sense amplifier. The first plot of FIG. 7 is at zero average inductor current, the second at close to maximum negative current and third at maximum positive current.

The feedback capacitor $C_f$ across the feed back resistor is not entirely necessary, but it does help stop the summer from ringing when it comes out of saturation. Its value should be roughly one tenth of $C_{im}$ or less so as to not slow down the summer response. The amplifier used for the summer should have a high enough bandwidth to yield the correct output at the desired switching frequency. The summer circuit in FIG. 6 is also inverting and hence we have add appropriate inversions to bring overall control system back to the correct polarities.

In this method of control, if the supply voltages are increased, the rate of rise of inductor current will increase, which will increase the switching frequency. The noise immunity circuit has another benefit in that it will limit the amount the frequency increases as it effectively increases the hysteresis if the period becomes too short.

The hysteretic current mode controller circuit was found to work very well in practice, achieving full bidirectional control of current with some excellent benefits. It has the fastest theoretically possible current response and essentially simplifies the control. It always limits current to Max/min during all start-up, transients and short circuit conditions which prevents damage to switching devices. This gives a automatic soft start by limiting current to its maximum. In addition, the actual switching instants have a small time uncertainty because of noise, which means the switching frequency is naturally dithered around its average operating point. This provides the added benefit of spread spectrum noise reduction. This type of hysteretic controller can be used with other methods of current measurement, provided the current measurement is of required bandwidth and does not add too much group delay.

Voltage Control Loop

If the bidirectional hysteretic current mode control circuit described above is working correctly, then the response to a current signal step input will be as fast as it is theoretically possible for a switch mode converter to be. For example for a positive step input, the high side switch will stay on until the current reaches it sets point. Hence it will have a rising di/dt given by (Vcc−Vout)/L. For example, a 12V source with a 5V output and a 1 µH inductor, would have a rising di/dt of 7 A/µs. For most applications, we can assume that it acts very nearly like an ideal controlled current source, and we can model it as such for most voltage control loop purposes. The gain of the current source will be the inverse of the current sense amplifier gain V/Amp. As an example, if we consider a buck/boost converter with an output capacitance of $C_{out}$ equal to 100 uF, driven by a controlled current source with a gain of 10, then the spice circuit model and bode plot response for an AC analysis is given in FIG. 7. The phase lag is a constant 90 degrees and the gain goes through zero db at 15 kHz. If we consider the di/dt limit is 7 A/us, then the dv/dt input limit is (7/20) V/us, which means the gain and phase of this circuit would only start to be rolled off at 55 kHz. In this case it is a fair assumption to model the hysteretic current controller as an ideal voltage controlled current source. If really fast voltage loops with a small output capacitances are needed it will be necessary to include the current di/dt limits which will roll off the gain more and roll off the phase more than 90 degrees at the frequency the di/dt limit is reached.

A simple proportional control circuit would suffice to control this circuit, provided the proportional controller did not add any more phase lag before overall gain goes through 0 db. For reasonable gains and normal output voltage regulation of +/−0.5%, many amplifiers could control the above system easily in a simple proportional only configuration.

However, if we require very tight voltage control tolerance of the output voltage, then much larger gains with low offsets will be needed. For example, using a buck boost converter in a battery cell balancer application requires the output voltage to be regulated to within 1 mV, (approximately 1 mV/5V=+/−0.02%) with total system offsets of only a few microvolts. This means the voltage difference amplifier must have gain of approximately 5000 and offsets of less than a 2-3 µV. This mandates the use of instrumentation type amplifiers that usually use switched capacitor circuits to reduce the input offsets. These type of amplifiers do not have a very high bandwidth and will add considerable phase lag when used with such high gains. As an example of this, FIG. 8 show a typical instrumentation amplifier added to current source circuit of FIG. 7 with a pure proportional gain of 1000. The system is unstable as when the phase of $V_{out}$ goes through zero degrees, there is still more than 30 db of gain.

To make this system stable, ideally we would like the phase margin to always be 45 degrees or more for the system to be critically damped i.e. the phase margin should remain above 45 degrees from DC until the gain goes through 0 dB. Many traditional methods were attempted to solve the control loop above when using very high DC gains with a low offset amplifier. For example, the first is simply adding a RC to roll off gain. However, in order to roll off the gain enough, the resistance of the RC circuit must be considerably lower than (<1/100) the feedback resistor $R_2$, and this will cause the phase margin to go below 10 degrees while gain is still fairly high. Although in theory this is still stable, in practice it will be very marginal and most likely oscillate. As we are trying to maintain DC information, we also can not add any form of blocking capacitor to advance phase, only lead RC circuits in parallel. Various combinations of lead and lag circuits, filters etc were tried but all did not provide adequate phase margins.

The circuit of FIG. 9 addressed the problem adequately. It comprised of carefully rolling off the gain with cascaded RC stages so that the phase margin always remained above 45 degrees. The first RC stage comprises $R_3$ and $C_3$, and $R_3$ should be selected to be roughly between ⅓ and ½ the value of $R_2$. Much less than ⅓ and the phase margin will be reduced to less than 45 degrees, and any more than ½ means you are not taking full advantage of the roll off capability. The same is true for all subsequent RC roll off stages i.e. $R_4$ should be in region of ⅓ to ½ $R_3$, $R_5$ should be in region of ⅓ to ½ $R_6$ etc. The actual values of resistors can be tuned to get exactly a 45 degree phase margin for all RC stages as seen in FIG. 10. The capacitors should be selected to be approximately ⅓ the previous value i.e. $C_4$ should be ⅓ $C_3$, $C_5$ should be ⅓ $C_4$ etc. which means the RC cut off frequencies are then almost a decade apart (or 9 to 10× previous frequency). This gives a optimum frequency spacing between RC stages, allowing them to roll off gain as fast as possible, but not letting the previous RC stage add phase lag to bring the phase margin below 45 degrees. Making capacitor more than ⅓ of the previous RC stage means the two circuits will add phase lags. Making it less than ⅓ means the phase margin will increase beyond 50 degrees between RC stages which is unnecessary, and more amplifier bandwidth will be required to include all RC stages. The number of RC stages required will be quite application specific but as many stages as necessary can be added until the desired roll off is attained. Rolling the gain off from 5000 all the way to 1 takes approximately 8 to 9 stages. Only one RC stage's capacitor value has to be selected and this will determine the rest. However, selecting this capacitor value is quite application specific and requires some engineering judgement. As a guideline the last RC roll off should happen before the amplifier itself starts to roll off phase.

The design procedure can be done by sequentially adding RC stages until the final gain is reached, while observing the bode plot to maintain phase margins. The capacitor for the first RC stage is estimated, but if the amplifier starts to roll off phase itself before the last RC stage, then all the capacitor values must be increased until the last RC stage is within the bandwidth of the amplifier.

The bode plot of the compensated circuit is shown in FIG. 11 and it can be seen that the phase margin is always above 45 degrees. This method of loop compensation has added benefits of helping the amplifier come out of saturation without oscillations. This overall system is also unconditionally stable and any amount of output capacitance can be added to the converter. The added output capacitance will simply roll off the gain faster and have no effect on phase. Hence it is suitable for attaching directly to super capacitors or batteries which appear as super large capacitances. The same compensation method above can easily be used with normal gains and less RC stages to obtain optimum voltage response and control loop bandwidth in normal power supply applications.

FIG. 12 shows by way of example only, one embodiment of a complete converter using the lossless current sense circuitry, the hysteresis combined with noise immunity circuitry, and the voltage loop compensation circuitry. It is a bidirectional converter between $V_{in}$ and $V_{out}$ and controls the inductor current directly in true hysteretic mode. Also shown by way of example only, switch S1 allows the converter shown in FIG. 12 to be used to control either the output bidirectional current or the output voltage. The above mentioned embodiment merely illustrates the principles of the present invention. Clearly, numerous other embodiments of converter controllers may be made by those skilled in the art without departing from the scope of this invention.

What is claimed is:

1. A method to attain stability when closing the loop to control the output voltage of a current mode controlled converter when using a very high gain, comprising:
   a difference amplifier positioned between a desired output voltage set point and the output voltage;
   said difference amplifier having a first feedback resistor connected between the output of the amplifier and its negative input;
   said first feedback resistor setting a DC gain of the difference amplifier;
   said difference amplifier having a first RC stage added in parallel across said first feedback resistor;
   said first RC stage comprising a second feedback resistor in series with a first feedback capacitor connected in parallel across said first feedback resistor;
   said second feedback resistor being approximately ⅓ to ½ the value of said first feedback resistor;
   said difference amplifier having a second RC stage also added in parallel across said first feedback resistor;
   said second RC stage comprising a third feedback resistor in series with a second feedback capacitor also connected in parallel across said first feedback resistor;
   said third feedback resistor being approximately ⅓ to ½ the value of said second feedback resistor; and
   said second feedback capacitor being approximately ⅓ or less the value of said first capacitor.

2. The difference amplifier of claim 1, having further RC stages connected in parallel across said first feedback resistor, up to the $N^{th}$ stage whereby:
   said $N^{th}$ feedback resistor being approximately ⅓ to ½ the value of said $N^{th}$ −1 feedback resistor; and
   said $N^{th}$ −1 feedback capacitor being approximately ⅓ or less the value of said $N^{th}$ −2 feedback capacitor.

* * * * *